(12) United States Patent
Pavier et al.

(10) Patent No.: US 7,923,289 B2
(45) Date of Patent: Apr. 12, 2011

(54) PROCESS FOR FABRICATING A SEMICONDUCTOR PACKAGE

(75) Inventors: Mark Pavier, Felbridge (GB); Andy Farlow, Hassocks (GB)

(73) Assignee: International Rectifier Corporation, El Segundo, CA (US)

(*) Notice: Subject to any disclaimer, the term of this patent is extended or adjusted under 35 U.S.C. 154(b) by 684 days.

(21) Appl. No.: 11/731,140

(22) Filed: Mar. 30, 2007

(65) Prior Publication Data

US 2007/0231960 A1    Oct. 4, 2007

Related U.S. Application Data

(60) Provisional application No. 60/788,287, filed on Mar. 31, 2006.

(51) Int. Cl.
    *H01L 21/44* (2006.01)
(52) U.S. Cl. ........ 438/106; 438/108; 438/610; 438/612; 257/E23.018
(58) Field of Classification Search .................. 438/106, 438/108, 610, 612; 257/E23.018
See application file for complete search history.

(56) References Cited

U.S. PATENT DOCUMENTS

| | | | |
|---|---|---|---|
| 6,624,522 B2 * | 9/2003 | Standing et al. | 257/782 |
| 2004/0245648 A1 * | 12/2004 | Nagasawa et al. | 257/772 |
| 2008/0260941 A1 * | 10/2008 | Jin | 427/126.4 |

* cited by examiner

*Primary Examiner* — Andy Huynh
(74) *Attorney, Agent, or Firm* — Farjami & Farjami LLP

(57) ABSTRACT

A process for fabricating a semiconductor package which includes using an exothermically active nanoparticle paste to join an electrode of a semiconductor die to a support body.

18 Claims, 1 Drawing Sheet

PROCESS FOR FABRICATING A SEMICONDUCTOR PACKAGE

RELATED APPLICATION

This application is based on and claims priority to the U.S. Provisional Application Ser. No. 60/788,287, filed on Mar. 31, 2006, entitled Reactive Nano Pastes, to which a claim of priority is hereby made and the disclosure of which is incorporated by reference.

BACKGROUND AND SUMMARY OF THE INVENTION

The present application relates to semiconductor package assembly.

It is known that nano-meter size particles of a material exhibit a lower melting temperature than the material in bulk form. Thus, for the purpose of joining two bodies together it may be beneficial to use nanoparticles in order to reduce the process temperature.

WO 2004/026526 discloses a number of processes for using nanoparticles to join semiconductor parts. However, in the processes shown therein an external energy source (i.e. heat source) must be present to effect the melting of the nano-particles throughout the melting step.

It is also known to use an extremely thin stack of metals in film form to attach a semiconductor die to a heat spreader. The pre-formed films are inserted between a die and a heat spreader and react to create an alloy once an initial activation energy is applied (spark/laser or heat point).

In a process according to the present invention, the phenomenon of exothermic reaction is used as a method of efficiently joining materials together. Specifically, by using nano-sized particles of materials with exothermic properties, a low temperature initiation of the reaction can be instigated due to the particles having lower surface energy than standard micron sized particles. During the exothermic reaction, the joining layer will fully melt and then when the layer cools, a solid metallic joint with high thermal and electrical conductivity is obtained.

Exothermically reactive nano-particle paste is beneficial because it produces a metallic interface between the semiconductor die and a support body to which the die is joined with reduced thermal impedance. The method used for instigating the reaction (e.g. laser or momentary heat activation) is fast compared to the current joining processes, thus offering increased throughput at die bond/curing stage in the package assembly process.

Other features and advantages of the present invention will become apparent from the following description of the invention which refers to the accompanying drawings.

DETAILED DESCRIPTION OF THE FIGURES

Figure 1:
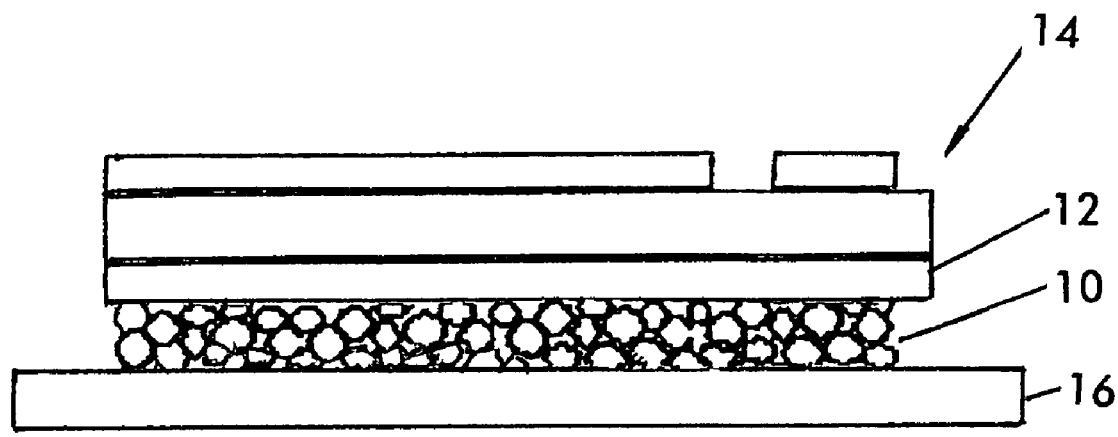
FIG. 1 illustrates a selected step in a process according to the present invention.

Referring to FIG. 1, in a process according to the present invention, a mass of electrically conductive and exothermically active nanoparticle paste 10 (a paste that includes a plurality of individual nano-meter sized particles) is disposed between an electrically conductive electrode 12 of a semiconductor die 14 and an electrically conductive support body 16.

Thereafter, energy is applied to a portion of paste 10 long enough to initiate an exothermic reaction in order to melt paste 10. During this step the increased surface area available within the nanoparticle paste creates sufficient heat for an exothermic reaction to take place at sites surrounding the initial activation area which in turn propagates throughout the paste body 10. For example, a spark can be applied to one portion of paste 10, or a short thermal step can be applied to initiate the exothermic reaction. The short thermal step can be carried out by a laser, a hot tipped instrument, an infrared (IR) source, an ultraviolet (UV) source, or a short application of heat in a convection oven. Note that, preferably, the energy so applied is discontinued after the exothermic reaction is initiated but before the completion of the exothermic reaction such that but for the energy required for initiation of the exothermic reaction no external energy source is required to melt the paste because the exothermic reaction is self-propagating and self-extinguishing.

After paste 10 is melted through the propagation of the exothermic reaction, it is cooled so that electrode 12 of semiconductor die 14 is electrically and mechanically joined to support body 16.

Note that nanoparticle paste 10 may include metallic nanoparticles that are between 20-200 nanometers wide. Examples of typical materials which could be formed into nanoparticles and which have exothermic properties are nickel, copper and aluminum.

The use of exothermic nanoparticles with rapid melt and solidification will allow the final joint to retain a high melting temperature with associated benefits of resisting subsequent semiconductor processes such as lead-free board mounting having a high reflow temperature of up to 260° C. which can damage many existing joints and materials.

Also, optionally, glass nanoparticles of preferably less than 100 nm may be added as filler materials in order to overcome existing limitations of glass based adhesives of high melt temperature and long processing time.

A common die attach adhesive with Silver/glass constituent (by weight 80%/20% respectively) has a typical melt temperature of 350°-450° C. for 15 minutes or more using, for example, a belt furnace. By using glass nanoparticles the temperature required to melt the glass is reduced to below 300° C. Thus, a paste containing 80% silver nanoparticles and 20% glass nanoparticles can melt at much lower temperatures. With adhesive melt temperatures below 300° C., many more substrates can be used in the assembly of semiconductor packages and the final cured adhesive joint will retain a higher overall melt temperature above temperatures likely to be seen in other assembly operations and end processes such as board mount reflowing.

Other materials suitable for nanoparticles in a process according to the present invention include:
  a) pure metals such as silver, copper and bismuth;
  b) binary alloyed metals such as alloys from silver/copper, bismuth/silver, silver/aluminum and tin/silver systems;
  c) ternary alloyed metals such as an alloy from tin/bismuth/copper system.

In an alternative process, in order to initiate the exothermic reaction, the two areas to be joined are coated each with an exothermic nanoparticle paste, and the coated surfaces are brought together to commence the exothermic reaction. Thus, electrode 12 and support 16 are both coated with an exothermic nanoparticle paste and the two coated bodies are put in contact to initiate the exothermic reaction to melt the two nanoparticle paste bodies. Thereafter, the melted pastes are cooled to join electrode 12 to support 16.

Figure 2:
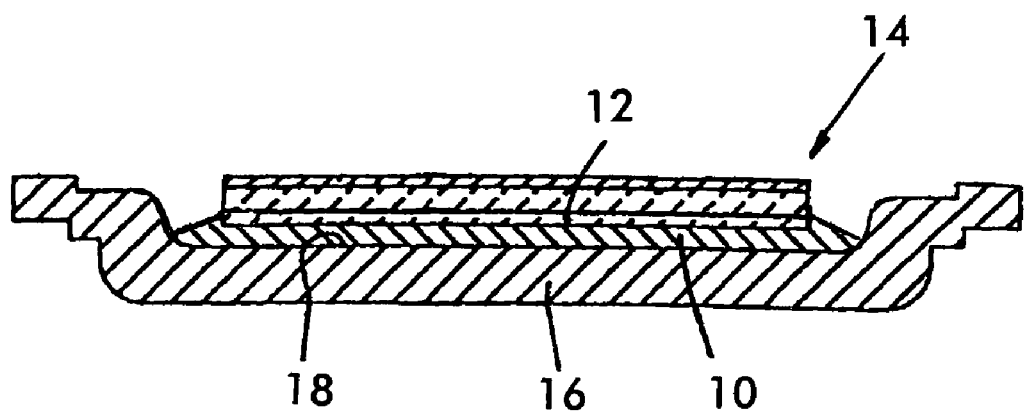
FIG. 2 illustrates a cup-shaped conductive clip suitable as a support body in an example of a process according to the present invention.

In a process according to the present invention, support body 16 can be a die pad portion of a lead frame, a die pad on a circuit board, a die pad on an IMS, a die pad on a DBC, or the like. Alternatively, as illustrated by FIG. 2, support body 16 may be a die receiving portion of a conductive clip such as a cup-shaped conductive clip having an interior die receiving surface 18 serving as support body 16 for receiving an electrode 12 (e.g., a drain electrode of a power MOSFET). Such a conductive clip can be found in U.S. Pat. No. 6,624,522 assigned to the assignee of the present application.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a power semiconductor device, comprising:
    disposing a mass of electrically conductive and exothermically active nanoparticle paste between an electrically conductive electrode of a semiconductor die and an electrically conductive support body;
    applying energy to a portion of said mass of electrically conductive nanoparticle paste long enough to initiate an exothermic reaction to melt said mass, wherein said applying is discontinued before the completion of said exothermic reaction; and
    cooling said molten mass to join said electrically conductive electrode to said electrically conductive support body.

2. The process of claim 1, wherein said conductive support body is a die pad.

3. The process of claim 1, wherein said support body is a conductive clip.

4. The process of claim 1, wherein said support body is a can-shaped conductive clip.

5. The process of claim 1, wherein said paste further includes glass nanoparticles.

6. The process of claim 1, wherein said paste includes pure nanoparticles.

7. The process of claim 6, wherein said pure nanoparticles are comprised of one of silver, copper, and bismuth.

8. The process of claim 1, wherein said paste includes alloyed nanoparticles.

9. The process of claim 8, wherein said alloyed nanoparticles are one of silver/copper alloy, bismuth/silver alloy, silver/aluminum alloy, tin silver alloy, and tin/bismuth/copper ternary alloys.

10. The process of claim 1, wherein said energy is applied from one of an infrared source, an ultraviolet source, or a convention oven.

11. The process of claim 1, wherein a spark applies said energy.

12. The process of claim 1, wherein a hot tipped instrument applies said energy.

13. The process of claim 1, wherein said nanoparticles are comprised of one of nickel, copper, and aluminum.

14. A process for fabricating a semiconductor device, comprising:
    disposing a mass of conductive and exothermically active nanoparticle paste between a semiconductor die and a support body;
    applying energy to a portion of said mass of conductive and exothermically active nanoparticle paste long enough to initiate an exothermic reaction to melt said mass, wherein said applying is discontinued before the completion of said exothermic reaction; and
    cooling said molten mass to join said semiconductor die to said support body.

15. The process of claim 14, wherein said disposing of said mass of paste is between an electrically conductive electrode of said semiconductor die and an electrically conductive portion of said support body.

16. The process of claim 14, wherein said support body is a can-shaped conductive clip.

17. The process of claim 14, wherein said paste includes a plurality of metallic nanoparticles.

18. The process of claim 14, wherein said paste includes a plurality of glass nanoparticles.

* * * * *